(12) United States Patent
Seo (10) Patent No.: US 12,292,478 B2
(45) Date of Patent: May 6, 2025

(54) BATTERY MODULE INSPECTION APPARATUS HAVING POSITIONALLY ADJUSTABLE COUPLING PORTION

(71) Applicant: LG ENERGY SOLUTION, LTD., Seoul (KR)

(72) Inventor: Ki Young Seo, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 18/030,588

(22) PCT Filed: Aug. 25, 2022

(86) PCT No.: PCT/KR2022/012699
§ 371 (c)(1),
(2) Date: Apr. 6, 2023

(87) PCT Pub. No.: WO2023/027520
PCT Pub. Date: Mar. 2, 2023

(65) Prior Publication Data
US 2023/0366934 A1    Nov. 16, 2023

(30) Foreign Application Priority Data

Aug. 25, 2021 (KR) .................. 10-2021-0112263

(51) Int. Cl.
*G01R 31/36* (2020.01)
(52) U.S. Cl.
CPC .............................. *G01R 31/3644* (2013.01)
(58) Field of Classification Search
None
See application file for complete search history.

(56) References Cited

U.S. PATENT DOCUMENTS

| 10,151,789 B2 | 12/2018 | Dehkordi et al. |
| 2002/0088113 A1* | 7/2002 | Hwang ............... G01R 31/01 29/844 |

(Continued)

FOREIGN PATENT DOCUMENTS

| JP | H07-111176 A | 4/1995 |
| JP | H09-106876 A | 4/1997 |

(Continued)

OTHER PUBLICATIONS

International Search Report (with partial translation) and Written Opinion dated Nov. 22, 2022, for corresponding International Patent Application No. PCT/KR2022/012699.

(Continued)

*Primary Examiner* — Jas A Sanghera
(74) *Attorney, Agent, or Firm* — Morgan, Lewis & Bockius LLP (57) ABSTRACT

The present invention relates to a battery module inspection apparatus including a coupling portion configured to be connected to a battery module connector, a stage having the coupling portion mounted to a lower part thereof, the stage being configured to move the coupling portion in a horizontal direction, a driving portion configured to move the stage in an upward-downward direction, a pair of guide portions disposed respectively at opposite sides of the coupling portion, the guide portions being configured to adjust the position of the coupling portion, and a shaft configured to serve as a reference axis along which the stage is moved in the upward-downward direction, wherein the coupling portion of the battery module inspection apparatus may be stably coupled to the battery module connector irrespective of position deviation of the battery module connector.

12 Claims, 9 Drawing Sheets

(56) References Cited

U.S. PATENT DOCUMENTS

| | | | | |
|---|---|---|---|---|
| 2015/0022228 A1* | 1/2015 | Motohashi | ........... | G01R 1/0675 |
| | | | | 324/754.11 |
| 2017/0269142 A1* | 9/2017 | Dehkordi | ............. | G01R 31/389 |
| 2018/0074130 A1 | 3/2018 | Jeung et al. | | |

FOREIGN PATENT DOCUMENTS

| | | | |
|---|---|---|---|
| JP | 2003-045605 | A | 2/2003 |
| JP | 3150375 | U | 5/2009 |
| JP | 2014-203628 | A | 10/2014 |
| JP | 2015-220164 | A | 12/2015 |
| JP | 2018-510332 | A | 4/2018 |
| JP | 2018-511159 | A | 4/2018 |
| KR | 10-0524419 | B1 | 10/2005 |
| KR | 10-1529265 | B1 | 6/2015 |
| KR | 10-1630214 | B1 | 6/2016 |
| KR | 10-2016-0143068 | A | 12/2016 |
| KR | 10-2019-0007644 | A | 1/2019 |
| KR | 10-2187649 | B1 | 12/2020 |

OTHER PUBLICATIONS

Notice of Allowance dated Jun. 10, 2024 issued in corresponding Japanese Patent Application No. 2023-528185. (Note: JP 2014-203628 A, Kr 10-1630214 B1, and KR 10-0524419 B1 cited therein were cited in a prior IDS.).

* cited by examiner

BATTERY MODULE INSPECTION APPARATUS HAVING POSITIONALLY ADJUSTABLE COUPLING PORTION

TECHNICAL FIELD

This application claims the benefit of priority to Korean Patent Application No. 2021-0112263 filed on Aug. 25, 2021, the disclosure of which is incorporated herein by reference in its entirety.

The present invention relates to a battery module inspection apparatus having a positionally adjustable coupling portion. More particularly, the present invention relates to a battery module inspection apparatus configured such that the position of a coupling portion of the battery module inspection apparatus is adjustable such that the coupling portion can be coupled to a battery module connector even though position deviation of the battery module connector occurs in a battery module.

BACKGROUND ART

Improvement in stability and increase in capacity of a lithium secondary battery, which is capable of being charged and discharged, have been rapidly achieved, and kinds of devices that use the lithium secondary battery as an energy source have been increased.

For example, the lithium secondary battery has been widely used as an energy source for wireless mobile devices, which are small multifunctional products, or wearable devices, which are worn on the body, and has also been used as an energy source for electric vehicles and hybrid electric vehicles presented as alternatives to existing gasoline and diesel vehicles, which cause air pollution, or as an energy storage system (ESS).

In order to use the lithium secondary battery as a high-output, high-capacity energy source, such as an energy source of an electric vehicle, a plurality of battery cells may be connected to each other in series and/or in parallel to manufacture a battery module.

After assembly of the battery module including the plurality of battery cells, an inspection process for checking performance of the battery module is required.

Specifically, in order to check whether individual battery cells are defective and to check the control state of the battery cells, a coupling portion of a battery module inspection apparatus may be coupled to a battery module connector, and voltages and temperatures of the battery cells may be measured to check whether the battery cells are defective.

During a process of manufacturing the battery module, the battery module connector may be moved out of position due to movement of battery cells in a module case, whereby position deviation of the battery module connector may occur.

However, a coupling portion of a conventional battery module inspection apparatus is configured such that the coupling portion is moved downwards toward the battery module connector in the state in which the battery module is disposed at an inspection position and is moved upwards to the original position thereof, i.e. the coupling portion is moved only in an upward-downward direction.

If the position of the battery module connector is not aligned with the position of the coupling portion of the battery module inspection apparatus after being moved downwards, therefore, connection between the coupling portion of the battery module inspection apparatus and the battery module connector is difficult, which leads to poor inspection, whereby the battery module is reassembled, and therefore productivity is lowered.

In connection therewith, Patent Document 1 relates to an automatic connector connection apparatus for battery pack inspection, wherein a battery pack side connector is fixed by a clamp so as to be movable, and the battery pack side connector is electrically connected to or disconnected from an inspection apparatus side connector, whereby automatic connection and disconnection between the battery pack side connector and the inspection apparatus side connector is achieved.

In Patent Document 1, the battery pack side connector, which is movable, is connected to the inspection apparatus side connector using the clamp, and therefore this patent document does not suggest a structure capable of preventing the occurrence of position deviation of a battery module connector when the battery module connector is configured to be fixed to an outer surface of a battery module.

Therefore, there is a need for a battery module inspection apparatus configured such that a coupling portion of the battery module inspection apparatus is accurately coupled to a battery module connector even though position deviation of the battery module connector occurs, thereby it is possible to prevent poor inspection.

PRIOR ART DOCUMENT (Patent Document 1) Japanese Patent Application Publication No. 2014-203628 (2014.10.27)

DISCLOSURE

Technical Problem

The present invention has been made in view of the above problems, and it is an object of the present invention to provide a battery module inspection apparatus having a positionally adjustable coupling portion configured such that the coupling portion of the battery module inspection apparatus is moved in a horizontal direction and a vertical direction, whereby the coupling portion is coupled to a battery module connector without an error in order to check whether a battery module is defective.

Technical Solution

A battery module inspection apparatus according to the present invention to accomplish the above object includes a coupling portion configured to be connected to a battery module connector, a stage having the coupling portion mounted to a lower part thereof, the stage being configured to move the coupling portion in a horizontal direction, a driving portion configured to move the stage in an upward-downward direction, a pair of guide portions disposed respectively at opposite sides of the coupling portion, the guide portions being configured to adjust the position of the coupling portion, and a shaft configured to serve as a reference axis along which the stage is moved in the upward-downward direction.

A guide pin may be added to a tip of a lower part of each of the guide portions.

Each of the guide portions may be configured to have a structure in which the length of each of the guide portions is increased or decreased due to movement of the stage and the coupling portion in the upward-downward direction.

An upper part of each of the guide portions and the coupling portion may be coupled to the stage so as to be fixed thereto, and the stage may be moved along the tip of the lower part of each of the guide portions.

The coupling portion may be located above the battery module connector as the result of movement of the stage.

A plate may be coupled to the lower part of the stage, the shaft may be disposed such that the shaft extends through the plate so as to be perpendicular to the plate, and the stage and the coupling portion may be moved along the shaft as a reference axis in the upward-downward direction.

The shaft may include a cylindrical upper part and a tapered part having a diameter gradually decreased toward a tip of a lower part thereof.

The coupling portion may be movable in the horizontal direction in proportion to a decrease in diameter of the tapered part.

The shaft may be located at at least two of corner parts of the plate.

A protrusion may be formed on a surface of a connection part of the coupling portion that is coupled to the battery module connector.

The coupling portion may be positionally moved in conjunction with the movement of the stage in the horizontal direction.

When the guide pin provided at the tip of the lower part of each of the guide portions is inserted into a recess formed in a battery module, the stage may be moved and the coupling portion may be disposed above the battery module connector.

In addition, the present invention may provide various combinations of the above solving means.

Advantageous Effects

As is apparent from the above description, a battery module inspection apparatus according to the present invention includes a stage configured to allow a coupling portion connected to a battery module connector to be moved in a horizontal direction, whereby it is possible to accurately couple the coupling portion to the battery module connector even though position deviation of the battery module connector occurs.

In addition, a protrusion is formed on a surface of the coupling portion, and the coupling portion has a large area, whereby the coupling portion may be stably connected to the battery module connector.

In addition, since the stage is movable along a shaft in an upward-downward direction, the stage may be moved upwards along the shaft and may then return to the initial position thereof after inspection of a battery module is completed. Since the initial position of the coupling portion is always uniform, as described above, it is possible to secure stable connection between the coupling portion and the battery module connector even though position deviation of the battery module connector continuously occurs.

MODES OF PRACTICE

Now, embodiments of the present invention will be described in detail with reference to the accompanying drawings such that the embodiments of the present invention can be easily implemented by a person having ordinary skill in the art to which the present invention pertains. In describing the principle of operation of the preferred embodiments of the present invention in detail, however, a detailed description of known functions and configurations incorporated herein will be omitted when the same may obscure the subject matter of the present invention.

In addition, the same reference numbers will be used throughout the drawings to refer to parts that perform similar functions or operations.

In the case in which one part is said to be connected to another part throughout the specification, not only may the one part be directly connected to the other part, but also, the one part may be indirectly connected to the other part via a further part. In addition, that a certain element is included does not mean that other elements are excluded, but means that such elements may be further included unless mentioned otherwise.

In addition, a description to embody elements through limitation or addition may be applied to all inventions, unless particularly restricted, and does not limit a specific invention.

Also, in the description of the invention and the claims of the present application, singular forms are intended to include plural forms unless mentioned otherwise.

Also, in the description of the invention and the claims of the present application, "or" includes "and" unless mentioned otherwise. Therefore, "including A or B" means three cases, namely, the case including A, the case including B, and the case including A and B.

Figure 1:
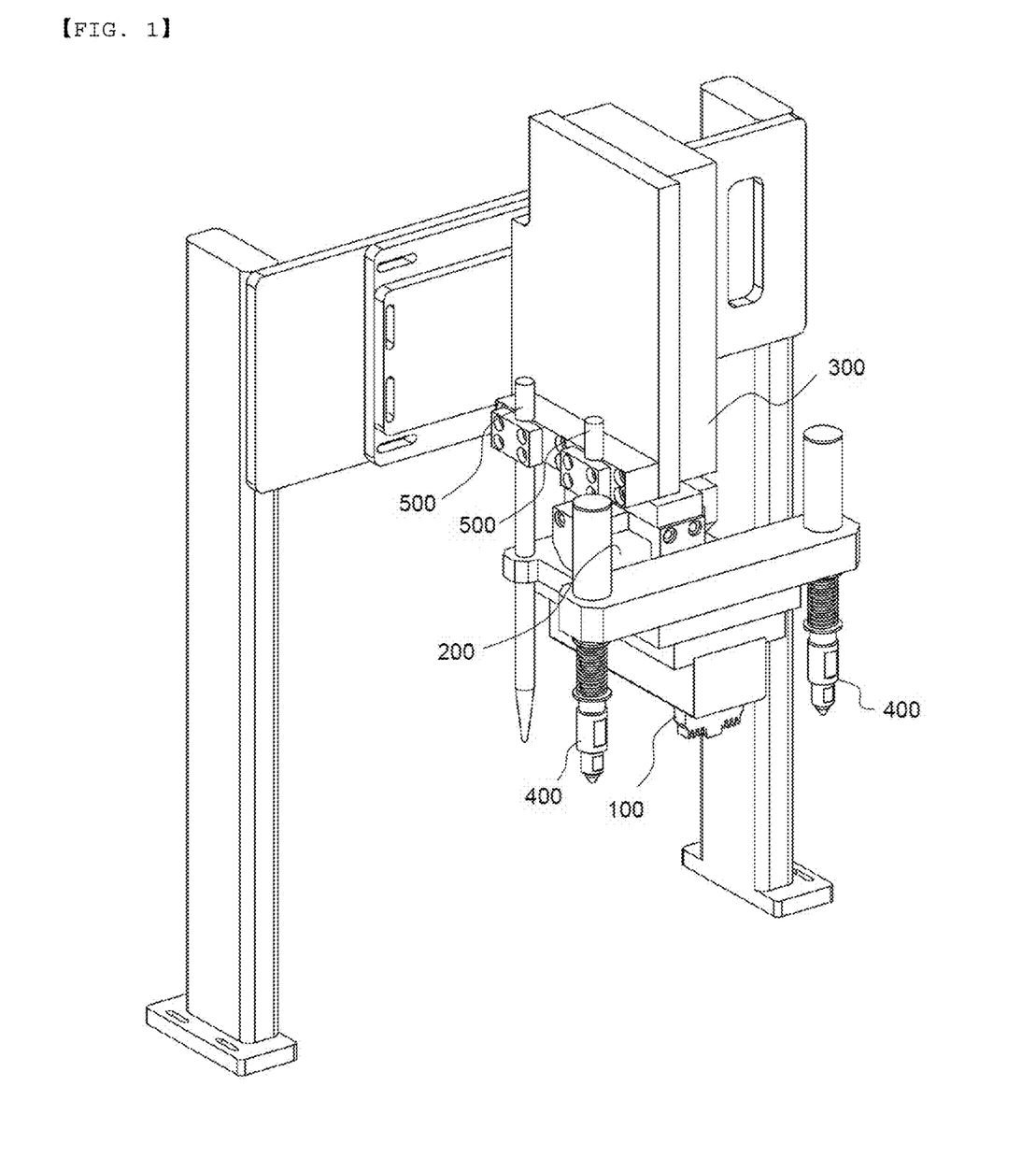
FIG. 1 is a perspective view of a battery module inspection apparatus according to the present invention.
Figure 2:
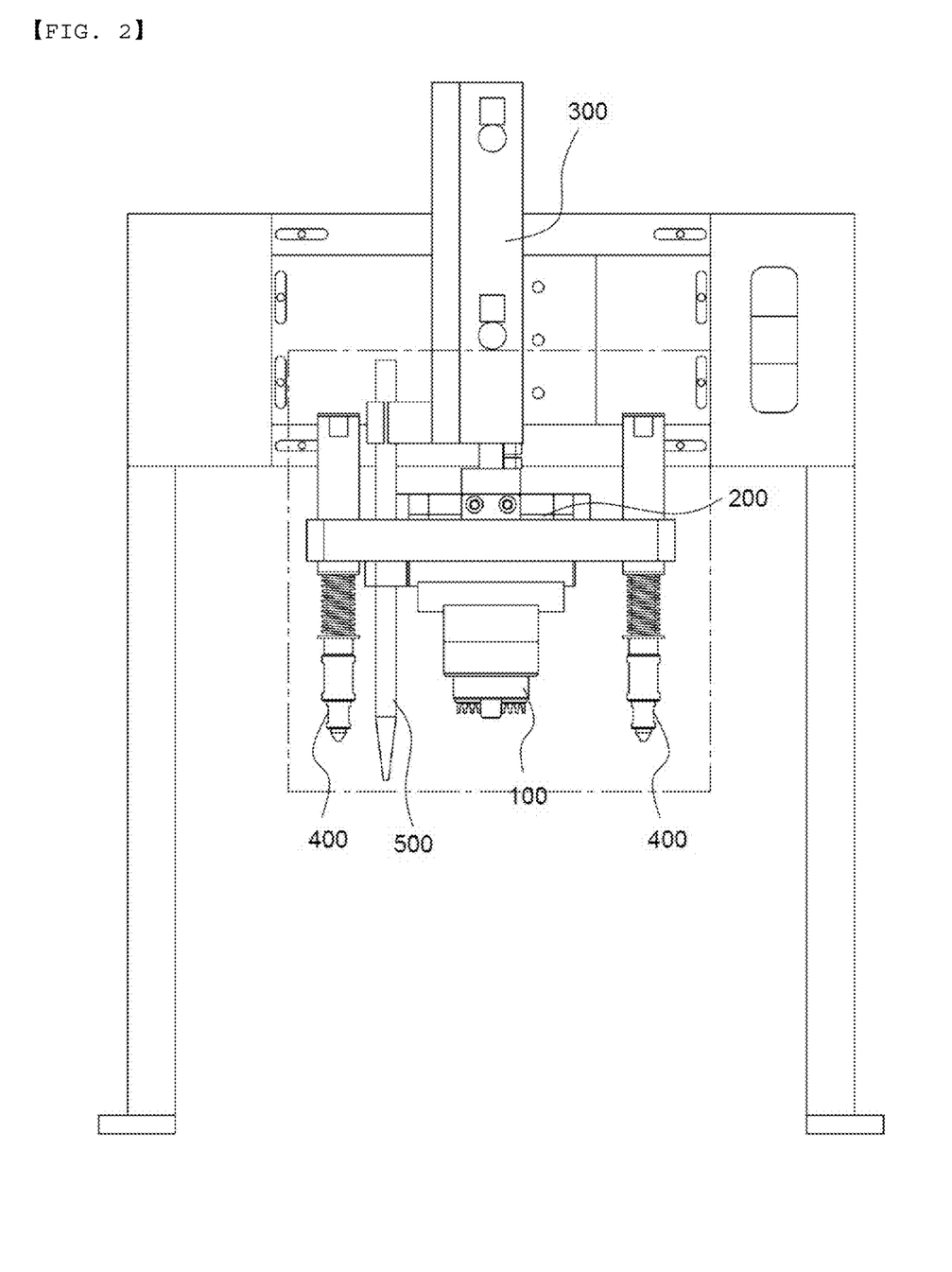
FIG. 2 is a front view of FIG. 1.

FIG. 1 is a perspective view of a battery module inspection apparatus according to the present invention, and FIG. 2 is a front view of FIG. 1.

Referring to FIGS. 1 and 2, the battery module inspection apparatus according to the present invention includes a coupling portion 100 configured to be connected to a battery module connector, a stage 200 having the coupling portion 100 mounted to a lower part thereof, the stage being configured to move the coupling portion 100 in a horizontal direction, a driving portion 300 configured to move the stage 200 in an upward-downward direction, a pair of guide portions 400 disposed respectively at opposite sides of the coupling portion 100, the guide portions being configured to adjust the position of the coupling portion, and a shaft 500 configured to serve as a reference axis along which the stage 200 is moved in the upward-downward direction.

An upper part of each of the guide portions 400 and the coupling portion 100 are coupled to the stage 200 so as to be positionally fixed thereto. When the guide portions 400 are moved, therefore, the stage 200 may be moved together with the guide portions 400, and movement of the coupling portion 100 may occur in conjunction with the movement of the stage 200 in the horizontal direction.

That is, as the position of a tip of a lower part of each of the guide portions 400 is moved, the stage 200 is moved. When the tip of the lower part of each of the guide portions 400 is moved downwards so as to be inserted into a recess-shaped guide portion coupling position of a battery module, movement of the stage 200 in the horizontal direction may occur, and the coupling portion 100 coupled to the stage 200 so as to be fixed thereto may be connected to the battery module connector due to the movement of the stage 200.

The distance between the coupling portion 100 and each of the pair of guide portions 400 is equal to the distance between the battery module connector and the guide portion coupling position of the battery module. When the guide portions 400 are moved to the guide portion coupling position, the coupling portion 100 is disposed above the battery module connector.

When the guide portions 400 are moved downwards while being inserted into the guide portion coupling position in this state, the coupling portion 100 may also be moved downwards and connected to the battery module connector. That is, the stage 200 according to the present invention is movable in the horizontal direction together with upward-downward movement thereof by the driving portion 300. For the upward-downward movement of the stage 200, the stage 200 may be mounted to the driving portion 300, and a pneumatic cylinder may be used as the driving portion 300. The kind of the driving portion according to the present invention is not particularly restricted, and a conventional construction may be applied as long as the conventional construction is constituted by a structure and a power source capable of transferring the stage in the upward-downward direction and the horizontal direction.

Meanwhile, if the distance between the driving portion 300 and the coupling portion 100 is long, force of the driving portion 300 may not be properly transferred to the coupling portion 100, whereby a phenomenon in which the coupling portion, which is located in front, is loosened may occur. For example, when a conventional battery module inspection apparatus is configured such that the distance between the driving portion and the coupling portion is 140 mm, it is more difficult to adjust the position of the coupling portion due to the above phenomenon.

In the present invention, therefore, the distance between the driving portion 300 and the coupling portion 100 is set to less than 100 mm, specifically 80 mm, in order to solve the above problem.

Figure 3:
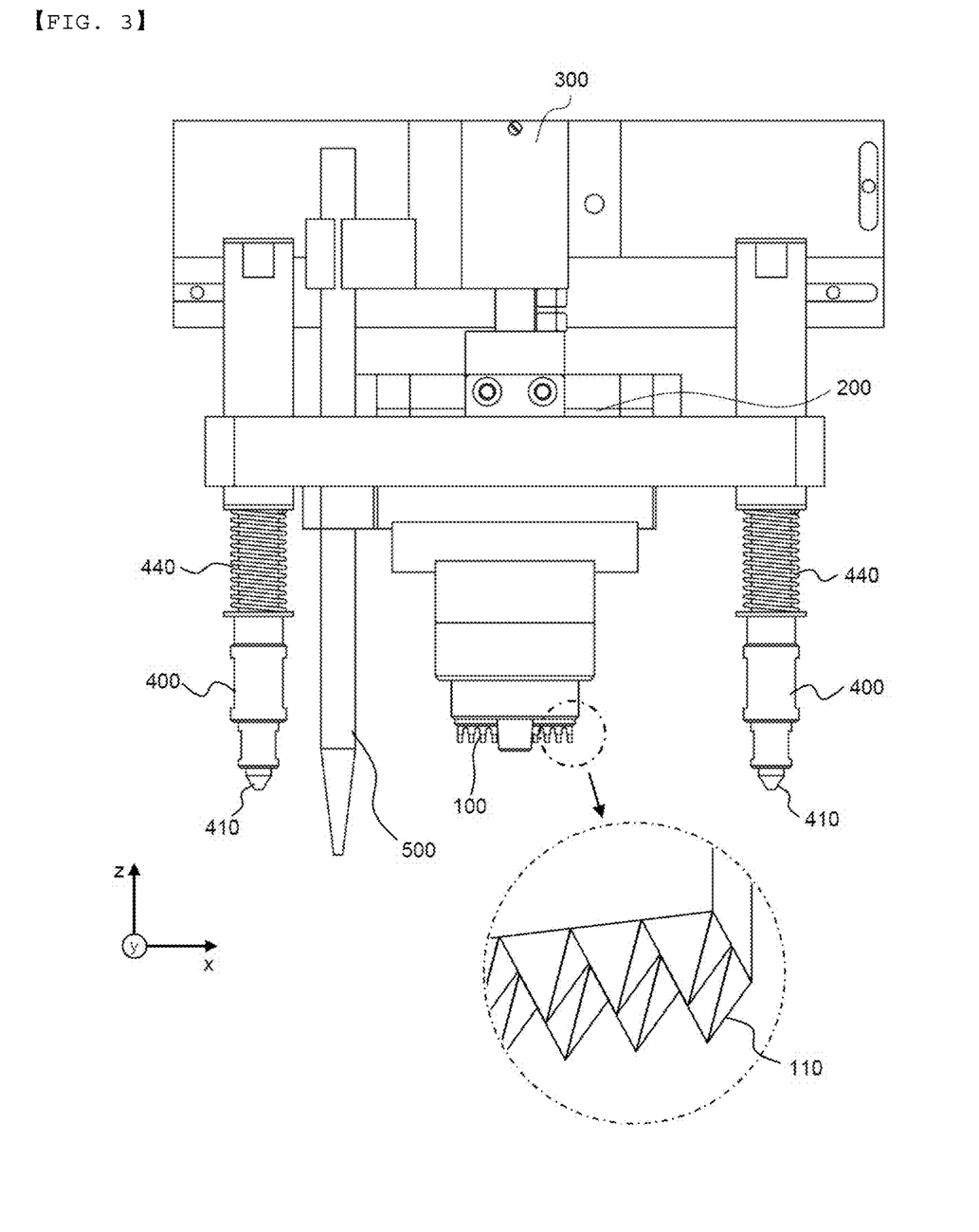
FIG. 3 is a partial enlarged view of FIG. 2.

FIG. 3 is a partial enlarged view of FIG. 2.

Referring to FIG. 3, a guide pin 410 is added to the tip of the lower part of each of the guide portions 400. Since the guide pin 410 is made of a material having very small frictional force and is configured to have a structure capable of being inserted along a surface slope of the battery module, the coupling portion 100 may be easily horizontally moved in an x-axis direction and a y-axis direction.

Each of the guide portions 400 includes a structure having a changeable length, such as a spring 440. When the stage 200 is moved in the upward-downward direction, i.e. a z-axis direction, the spring 440 may be contracted or extended, and the total length of each of the guide portions 400 may be increased or decreased.

A connection part of the coupling portion 100 that is coupled to the battery module connector has a size corresponding to the area of the battery module connector, and a protrusion 110 is formed on a surface of the connection part. In a conventional case in which a single cone is formed on the entirety of the connection part, there is a problem in that connection between a tip of the cone and the battery module connector is not well achieved. In contrast, when a plurality of protrusions is formed on the surface of the connection part, as in the present invention, contact between the battery module connector and the coupling portion is more easily achieved.

Although the plurality of protrusions is formed on the surface of the connection part, an embossed structure, such as a lattice structure, may be formed on the surface of the connection part.

Figure 4:
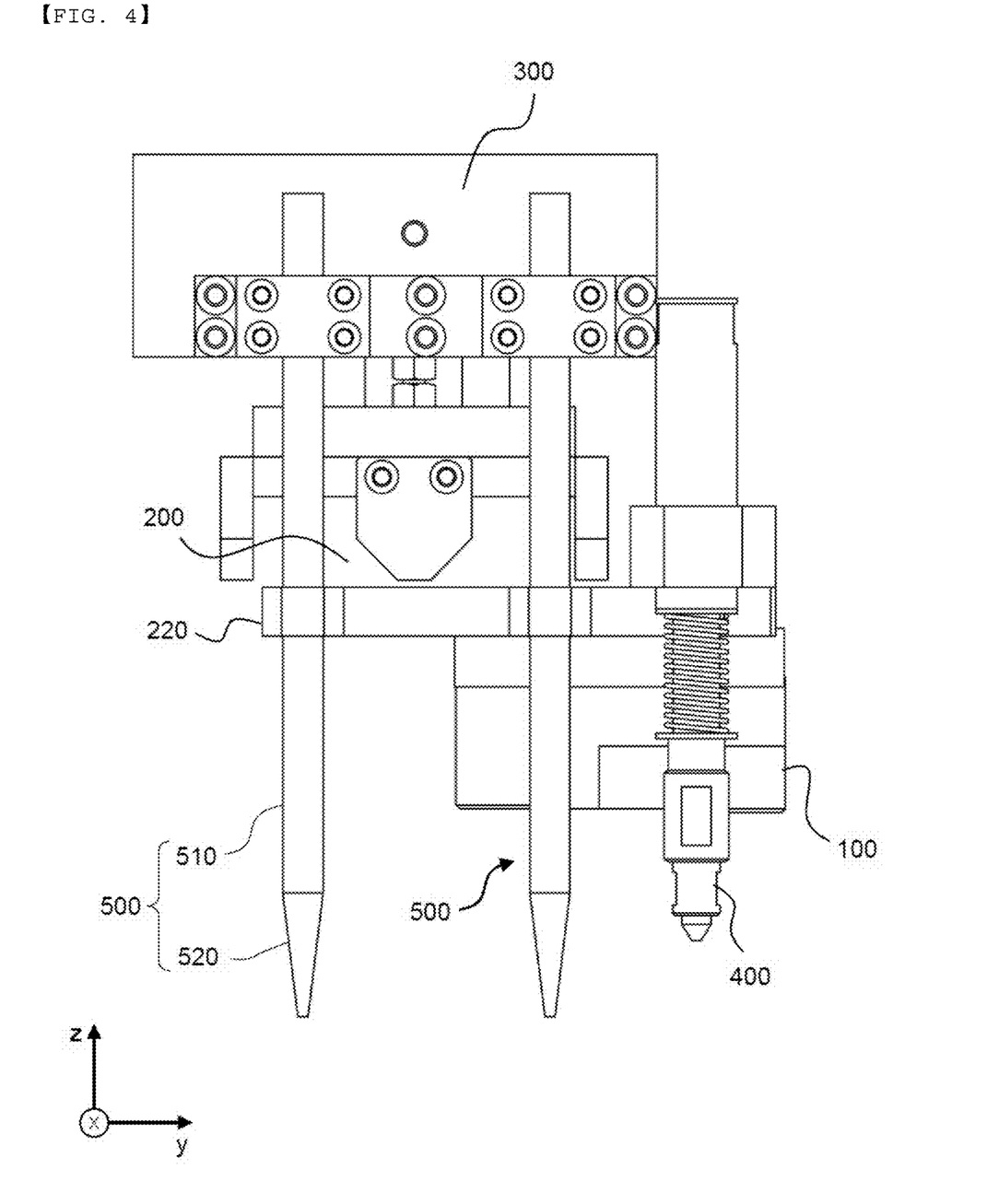
FIG. 4 is a side view of FIG. 3.
Figure 5:
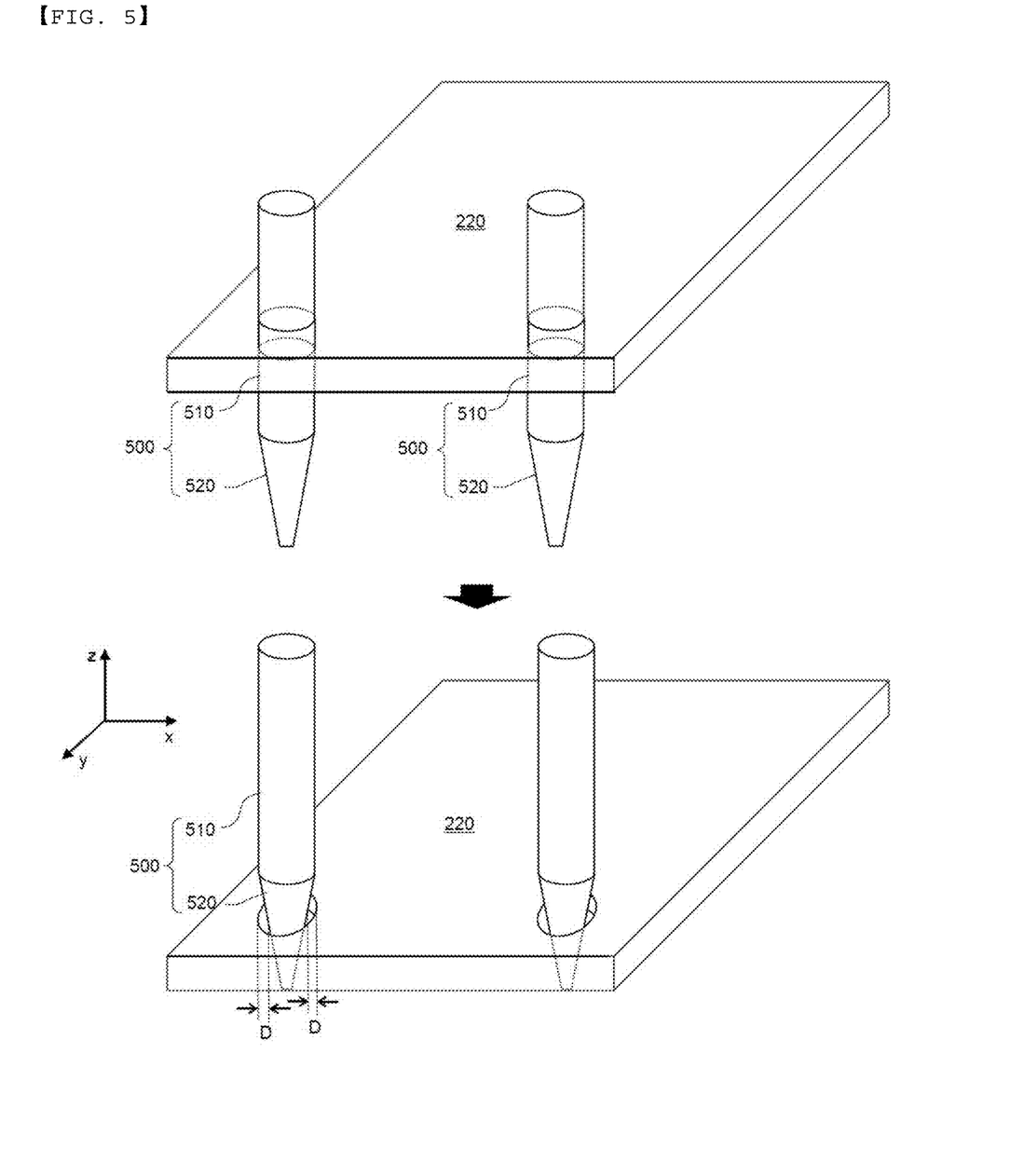
FIG. 5 is a perspective view of a plate and a shaft.

FIG. 4 is a side view of FIG. 3, and FIG. 5 is a perspective view of a plate and the shaft.

Referring to FIGS. 4 and 5, the stage 200 according to the present invention may be configured to have a quadrangular structure when viewed in plan and is movable along the shaft 500 as the reference axis in the upward-downward direction, i.e., the z-axis direction.

The plate 220 is coupled to the lower part of the stage 200, and the stage 200 is moved together with the plate 220 in the horizontal direction (direction parallel to an x-y plane) and the upward-downward direction (z-axis direction). The shaft 500 extends through the plate 220 so as to be perpendicular to the plate 220, and the stage 200 and the plate 220 may be moved along the shaft 500 as the reference axis in the z-axis direction.

The shaft 500 is located at two of four corner parts of the plate 220 such that the movement axis of the stage 200 in the upward-downward direction is uniformly maintained. Unlike what is shown in the figures, however, the number of shafts is not limited to two, and more than two shafts may be disposed. For example, the shaft may be located at each of the four corner parts of the plate, and the position of the shaft is not limited to each corner of the plate.

The shaft 500 includes a cylindrical upper part 510 and a tapered part 520 having a diameter gradually decreased toward a tip of a lower part thereof.

The diameter of a through-hole, through which the shaft 500 extends, formed in the plate 220 and the diameter of the shaft 500 have corresponding sizes. When the plate 220 is located at the upper part 510, the plate cannot be moved in the horizontal direction, i.e., the direction parallel to the x-y plane. In the state in which the plate 220 is moved downwards to the tapered part 520, however, the distance D is formed between the through-hole and the tapered part 520 in proportion to a decrease in diameter of the tapered part 520. Consequently, the plate 220 may be moved in the x-axis direction and the y-axis direction by the distance D, and the stage 200 may be moved in the x-axis direction and the y-axis direction as the result of the movement of the plate 220.

In consideration of the fact that the position deviation of the battery module connector is generally less than ±1 mm, the movement range of the stage in the x-axis direction and the y-axis direction may be ±3 mm, specifically ±2.5 mm. Consequently, the distance D may be formed so as to be less than 3 mm.

Figure 6:
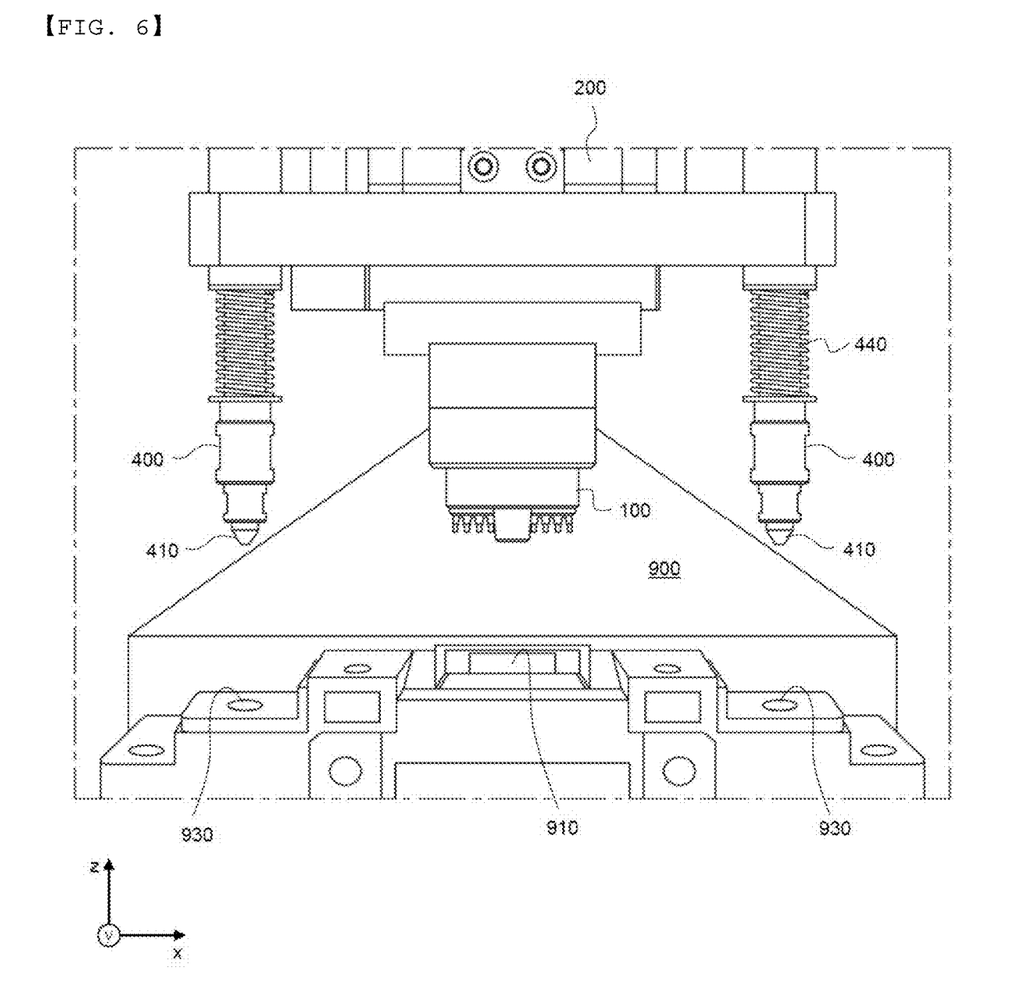
FIG. 6 is a front view showing the state before the battery module inspection apparatus is coupled to a battery module.
Figure 7:
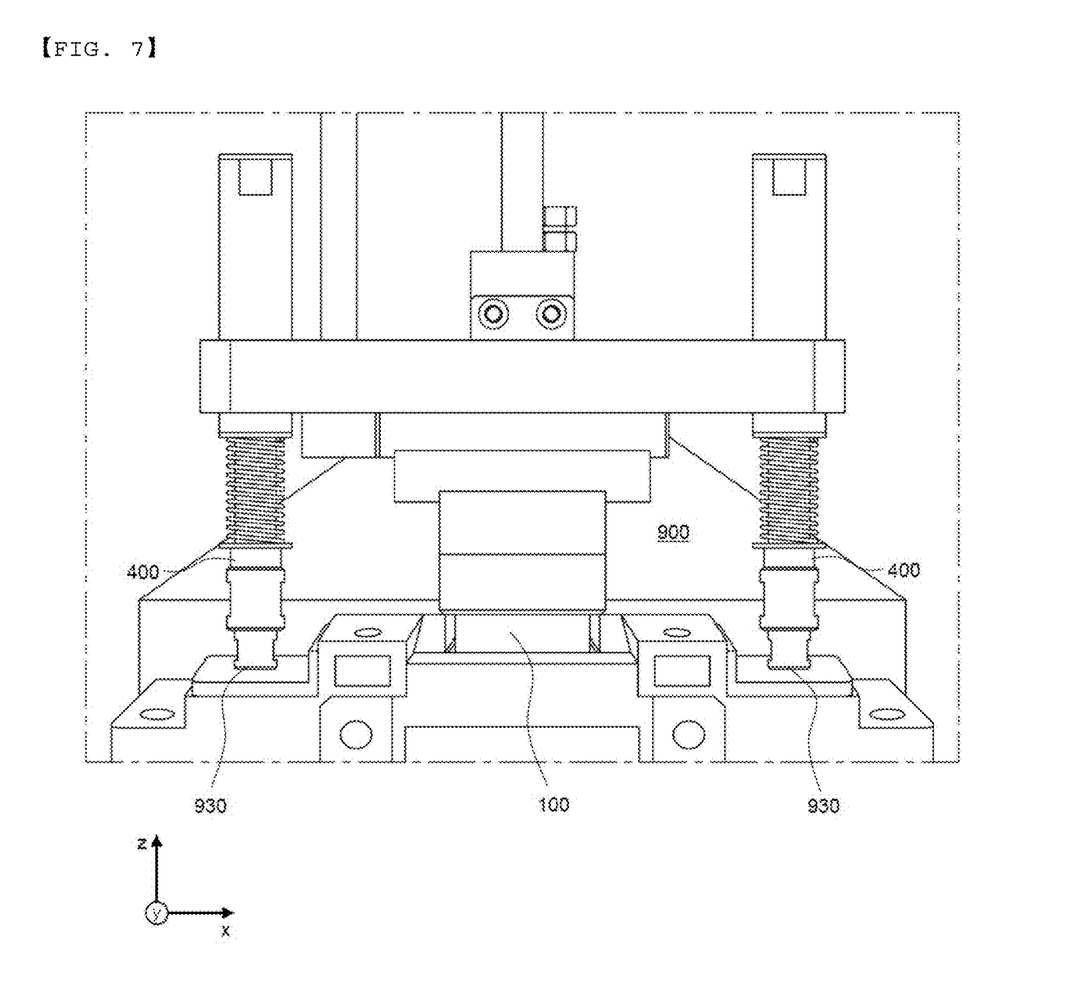
FIG. 7 is a front view showing the state in which the battery module inspection apparatus is coupled to the battery module.
Figure 8:
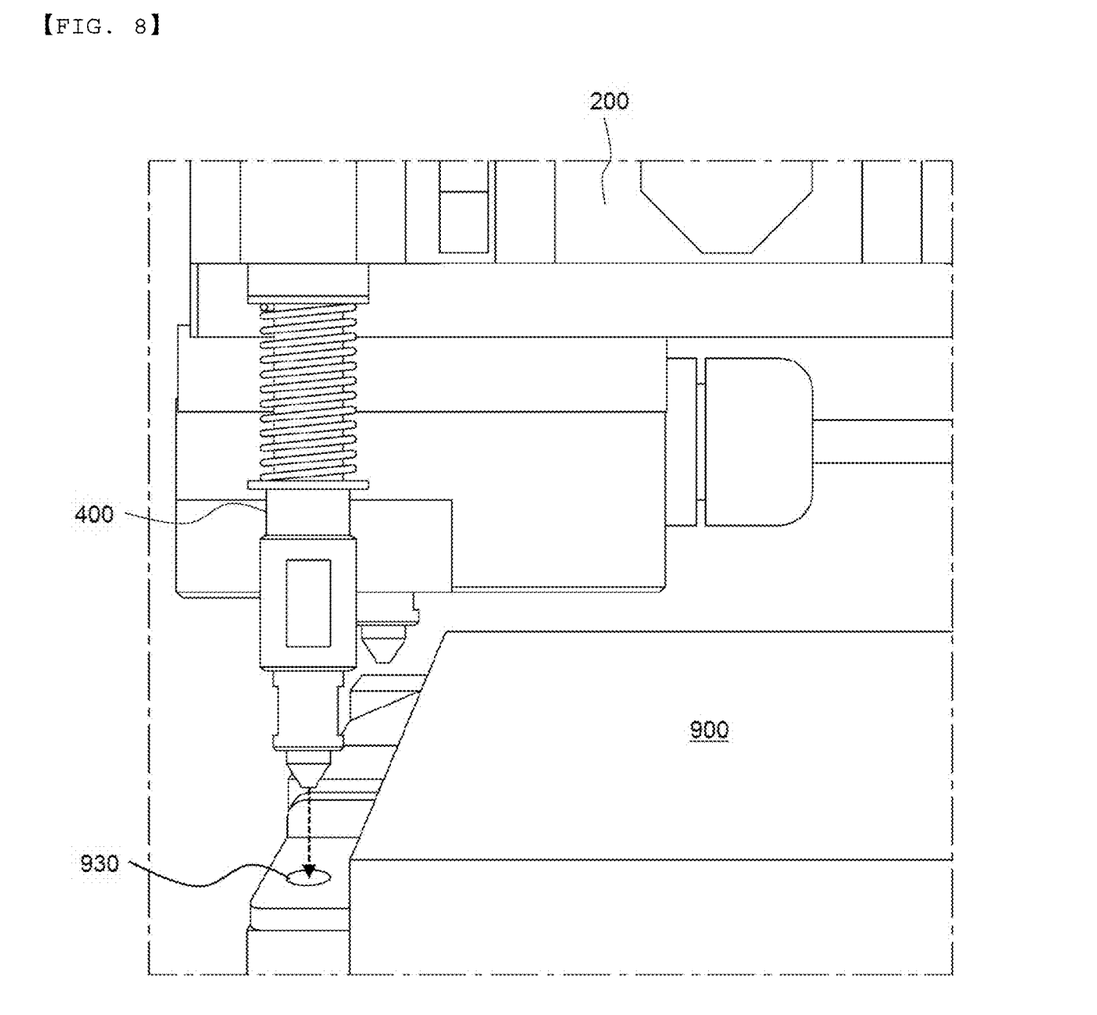
FIG. 8 is a side view of FIG. 6.
Figure 9:
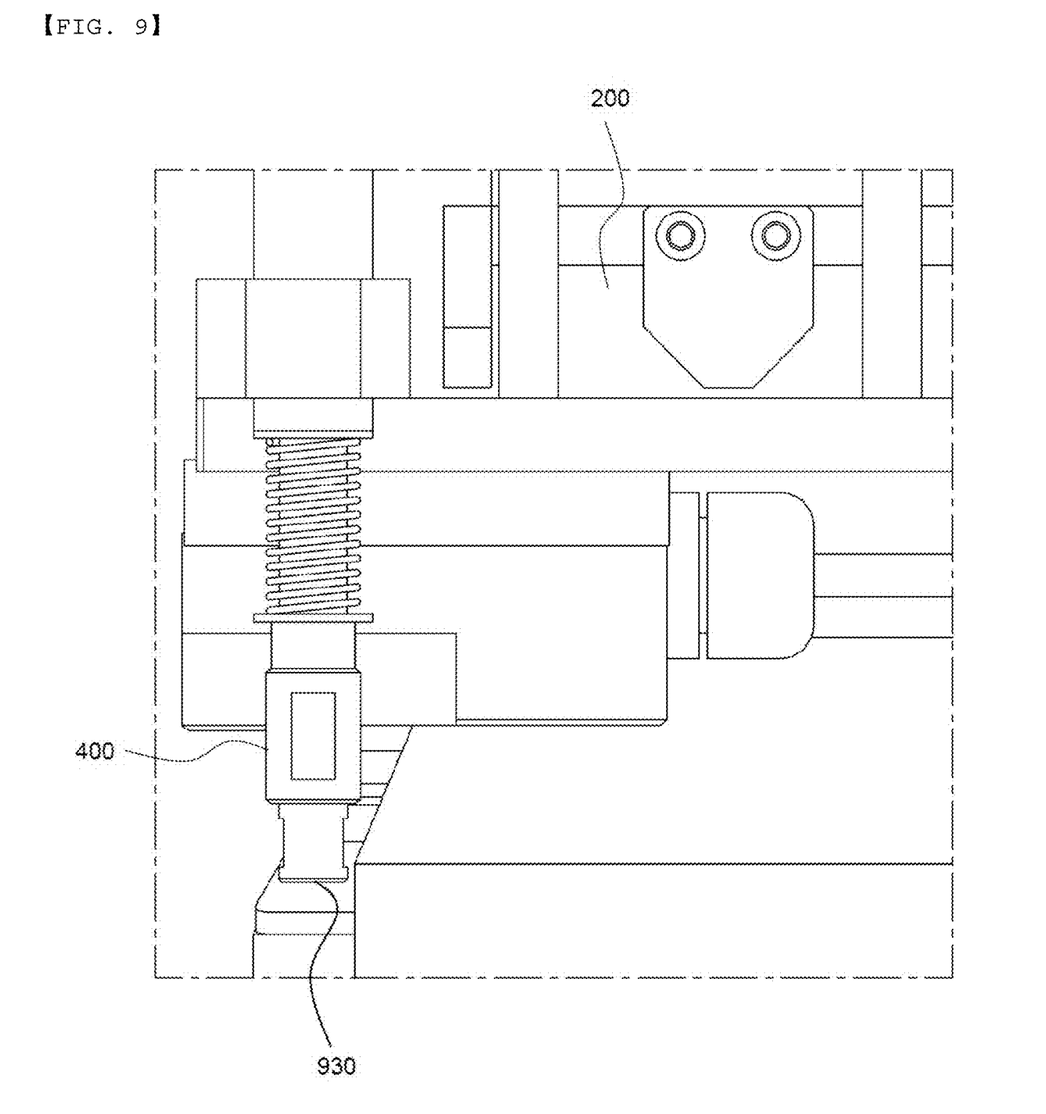
FIG. 9 is a side view of FIG. 7.

FIG. 6 is a front view showing the state before the battery module inspection apparatus is coupled to the battery module, FIG. 7 is a front view showing the state in which the battery module inspection apparatus is coupled to the battery module, FIG. 8 is a side view of FIG. 6, and FIG. 9 is a side view of FIG. 7.

Referring to FIGS. 6 to 9, the battery module 900 is disposed at an inspection position, i.e. under the battery module inspection apparatus, and the stage 200 is moved downwards in the z-axis direction, whereby the coupling portion 100 is moved downwards in the z-axis direction.

A pair of recesses 930, into which the pair of guide pins 410 formed respectively at the pair of guide portions 400 is inserted, is formed in the battery module 900, as the guide portion coupling position. When the driving portion is moved downwards, whereby each of the guide pins 410 is located close to a corresponding one of the recesses 930, the guide pin 410 is inserted into the recess 930 while being moved toward the center of the recess 930 along the slope of the recesses 930.

When the guide pin 410 is moved so as to be inserted into the recess 930, as described above, the stage 200 is moved in the horizontal direction, and the coupling portion 100 is located above the battery module connector 910 due to the movement of the stage 200.

When the guide pin 410 is inserted into the recess 930 in this state, the coupling portion 100 is moved downwards along the shaft as the reference axis in the z-axis direction, and therefore the coupling portion 100 is connected to the battery module connector, as shown in FIGS. 7 and 9.

When the battery module is inspected using the battery module inspection apparatus according to the present invention, as described above, the stage is movable in the horizontal direction and the upward-downward direction. Even though position deviation of the battery module connector occurs, therefore, coupling between the coupling portion and the battery module connector may be accurately performed. Consequently, it is possible to prevent the occurrence of an error in inspecting the battery module.

Those skilled in the art to which the present invention pertains will appreciate that various applications and modifications are possible within the category of the present invention based on the above description.

DESCRIPTION OF REFERENCE NUMERALS

100: Coupling portion
110: Protrusion
200: Stage
220: Plate
300: Driving portion
400: Guide portion
410: Guide pin
440: Spring
500: Shaft
510: Upper part
520: Tapered part
900: Battery module
910: Battery module connector
930: Recess

The invention claimed is:

1. A battery module inspection apparatus, comprising:
a coupling portion configured to be connected to a battery module connector;
a stage having the coupling portion mounted to a lower part of the stage, the stage being configured to move the coupling portion in a horizontal direction;
a driving portion configured to move the stage in an upward-downward direction;
a pair of guide portions disposed respectively at opposite sides of the coupling portion, the guide portions being configured to adjust a position of the coupling portion; and
a shaft configured to serve as a reference axis along which the stage is moved in the upward-downward direction, the shaft comprising:
a cylindrical upper part; and
a tapered lower part having a diameter gradually decreasing toward a tip of the lower part of the shaft.

2. The battery module inspection apparatus according to claim 1, further comprising a guide pin at a tip of a lower part of each of the guide portions.

3. The battery module inspection apparatus according to claim 1, wherein each of the guide portions has a structure in which a length of each of the guide portions is configured to increase or decrease based on a movement of the stage and the coupling portion in the upward-downward direction.

4. The battery module inspection apparatus according to claim 1, wherein:
an upper part of each of the guide portions and the coupling portion are coupled to the stage, and
the stage is configured to be moved along a tip of a lower part of each of the guide portions.

5. The battery module inspection apparatus according to claim 4, wherein the coupling portion is located above the battery module connector based on a movement of the stage.

6. The battery module inspection apparatus according to claim 1, wherein the coupling portion is movable in the horizontal direction in proportion to a decrease in a diameter of the tapered lower part.

7. The battery module inspection apparatus according to claim 1, wherein the coupling portion has a protrusion on a surface of a connection part of the coupling portion that is configured to be coupled to the battery module connector.

8. The battery module inspection apparatus according to claim 1, wherein the coupling portion is configured to be positionally moved in conjunction with a movement of the stage in the horizontal direction.

9. The battery module inspection apparatus of claim 1, further comprising:
a plate coupled to the lower part of the stage,
wherein the shaft extends through the plate and is perpendicular to the plate, and
wherein the stage and the coupling portion are configured to be moved along the shaft as a reference axis in the upward-downward direction.

10. A battery module inspection apparatus, comprising:
a coupling portion configured to be connected to a battery module connector;
a stage having the coupling portion mounted to a lower part of the stage, the stage being configured to move the coupling portion in a horizontal direction;
a driving portion configured to move the stage in an upward-downward direction;
a pair of guide portions disposed respectively at opposite sides of the coupling portion, the guide portions being configured to adjust a position of the coupling portion;
a shaft configured to serve as a reference axis along which the stage is moved in the upward-downward direction; and
a plate coupled to the lower part of the stage,
wherein the shaft extends through the plate and is perpendicular to the plate, and
wherein the stage and the coupling portion are configured to be moved along the shaft as a reference axis in the upward-downward direction.

11. The battery module inspection apparatus according to claim 10, wherein the shaft is located at at least two of corner parts of the plate.

12. A battery module inspection apparatus, comprising:
a coupling portion configured to be connected to a battery module connector;
a stage having the coupling portion mounted to a lower part of the stage, the stage being configured to move the coupling portion in a horizontal direction;

a driving portion configured to move the stage in an upward-downward direction;

a pair of guide portions disposed respectively at opposite sides of the coupling portion, the guide portions being configured to adjust a position of the coupling portion;

a shaft configured to serve as a reference axis along which the stage is moved in the upward-downward direction; and a guide pin at a tip of a lower part of each of the guide portions, wherein, with the guide pin provided at the tip of the lower part of each of the guide portions being inserted into a recess formed in a battery module, the stage is configured to be moved and the coupling portion is configured to be disposed above the battery module connector.

* * * * *